United States Patent
Chan et al.

[19]

[11] Patent Number: 6,087,881
[45] Date of Patent: Jul. 11, 2000

[54] INTEGRATED CIRCUIT DUAL LEVEL SHIFT PREDRIVE CIRCUIT

[75] Inventors: Francis Chan, Williston; Jeffrey H. Sloan, Burlington; Douglas W. Stout, Milton, all of Vt.

[73] Assignee: International Business Machines Corporation, Armonk, N.Y.

[21] Appl. No.: 09/121,515

[22] Filed: Jul. 23, 1998

[51] Int. Cl.[7] ................................................ H03L 5/00
[52] U.S. Cl. .......................... 327/333; 327/530; 326/62; 326/80
[58] Field of Search ................................. 327/112, 333, 327/530, 543; 326/62, 68, 80, 81

[56] References Cited

U.S. PATENT DOCUMENTS

| | | | |
|---|---|---|---|
| 4,551,636 | 11/1985 | Andrews et al. | 307/264 |
| 4,663,701 | 5/1987 | Stotts | 363/60 |
| 5,378,943 | 1/1995 | Dennard | 326/68 |
| 5,399,915 | 3/1995 | Yahata | 327/108 |
| 5,517,148 | 5/1996 | Yin | 327/333 |
| 5,559,464 | 9/1996 | Orii et al. | 327/333 |
| 5,834,948 | 11/1998 | Yoshizaki et al. | 326/81 |
| 5,900,750 | 5/1999 | Schmitt | 327/108 |
| 5,914,617 | 6/1999 | Bartlett | 326/81 |
| 5,926,055 | 7/1999 | Kashmiri et al. | 327/333 |
| 5,933,027 | 8/1999 | Morris et al. | 326/81 |

*Primary Examiner*—Tuan T. Lam
*Assistant Examiner*—Hai L. Nguyen
*Attorney, Agent, or Firm*—John J. Goodwin

[57] ABSTRACT

A dual stage voltage level predrive circuit for an integrated circuit chip including two level shifter stages in series. The voltage level shifting circuit uses single dielectric layer devices and three bias supply circuits each providing a different DC bias voltage for distributing bias voltages among the devices such that dielectric voltage stress across single dielectric layers is reduced. The first stage of the level shifting circuit receives a first input signal having a first voltage swing, converts the first voltage swing to a second voltage swing and provides a first output signal corresponding to the first input signal and having the second voltage swing. The second stage of the level shifting circuit receives the first output signal from the first stage, converts the second voltage swing to a third voltage swing and provides a final output signal having the third voltage swing.

12 Claims, 4 Drawing Sheets

INTEGRATED CIRCUIT DUAL LEVEL SHIFT PREDRIVE CIRCUIT

BACKGROUND OF THE INVENTION

1. Technical Field

The present invention relates to a voltage level shifting circuit which receives input signals at low voltage levels and generates output signals at higher voltage levels.

2. Background Art

In integrated circuit technology, voltage levels of one magnitude are employed for use with one type of electrical components on a chip while higher voltage levels are required for other types of circuit applications. Voltage level shifting circuits are used in such applications to shift voltage signals from lower levels to higher levels. Typical prior art references describing various embodiments of voltage level shifting technology are as follows:

U.S. Pat. No. 5,559,464 issued Sep. 24, 1996 to Orii et al. entitled SIGNAL VOLTAGE LEVEL CONVERSION CIRCUIT AND OUTPUT BUFFER CIRCUIT.

U.S. Pat. No. 5,399,915 issued Mar. 21 1995 to Yahata. entitled DRIVE CIRCUIT INCLUDING TWO LEVEL-SHIFT CIRCUITS.

U.S. Pat. No. 5,378,943 issued Jan. 3, 1995 to Dennard entitled LOW POWER INTERFACE CIRCUIT.

U.S. Pat. No. 4,663,701 issued May 5, 1987 to Stotts entitled VOLTAGE LEVEL SHIFTER.

U.S. Pat. No. 4,551,636 issued Nov. 5 1985 to Andrews et al. entitled WIDE BANDWIDTH SIGNAL COUPLING CIRCUIT HAVING A VARIABLE VOLTAGE-LEVEL SHIFT FROM INPUT TO OUTPUT.

SUMMARY OF THE INVENTION

An object of the present invention is to provide a dual stage voltage level predrive circuit.

Another object of the present invention is to provide a voltage level switching circuit including two level shifters in series and having no feedback paths or threshold dependence.

Still another object of the present invention is to provide a voltage level shifting circuit for an integrated circuit chip having single dielectric layer devices and at least three bias supply circuits each providing a different bias voltage for distributing bias voltages among the devices such that dielectric voltage stress across single dielectric layers is reduced.

A still further object of the present invention is to provide a voltage level shifting circuit having a first stage for receiving a first input signal having a first voltage swing, converting the first voltage swing to a second voltage swing and providing a first output signal corresponding to the first input signal and having the second voltage swing, the voltage level shifting circuit also having a second stage for receiving the first output signal, converting the second voltage swing to a third voltage swing and providing a final output signal having the third voltage swing.

Other features, advantages and benefits of the present invention will become apparent in the following description taken in conjunction with the following drawings. It is to be understood that the foregoing general description and the following detailed description are exemplary and explanatory but are not to be restrictive of the invention. The accompanying drawings which are incorporated in and constitute a part of this invention and, together with the description, serve to explain the principles of the invention in general terms. Like numerals refer to like parts throughout the disclosure.

DETAILED DESCRIPTION OF THE INVENTION

Figure 1:
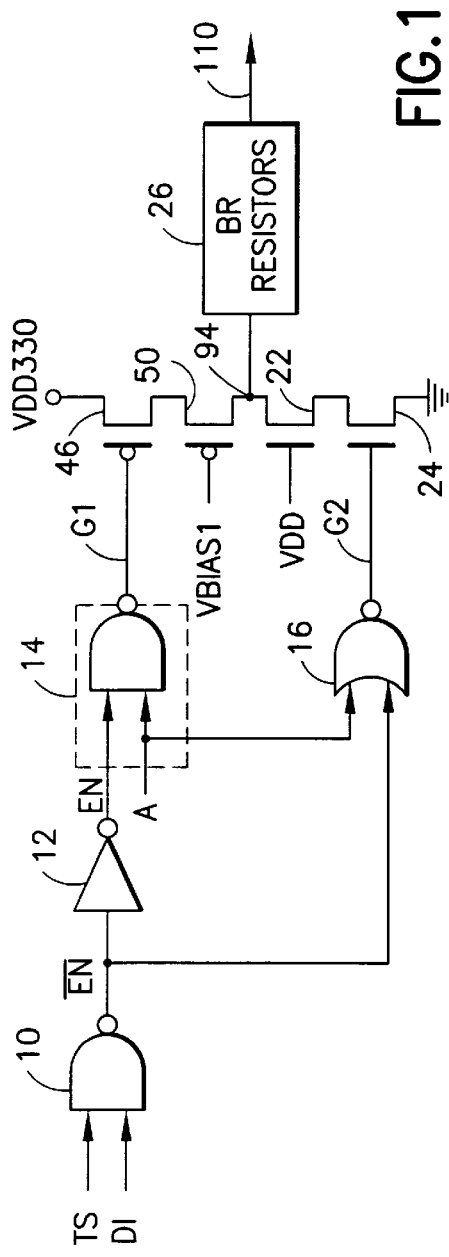
FIG. 1 is a schematic block diagram of an embodiment of a voltage level shifting circuit including a dual stage level shifter predrive circuit according to the principles of the present invention.

Referring to FIG. 1, a schematic of a level shifting circuit that includes a dual stage level shifter predrive circuit is shown. Input signals "TS" and "DI" are applied to NAND gate 10 and produce a "notEN" (ENbar) output signal which is inverted to an "EN" signal by NOT gate 12 and applied as an input signal to dual stage level shifter predrive circuit 14. An "A" signal is applied as a second input signal to predrive circuit 14 which provides an output signal on node G1. The output signal on node G1 from level shifter predrive circuit 14 is applied to the gate of PFET transistor 46.

The A signal is also applied as an input signal to NOR gate 16 along with the notEN signal from NAND gate 10 to provide an output node G2 which is applied to the gate of transistor 24. A VBIAS1 voltage is applied to the gate of transistor 50 and a VDD voltage is applied to the gate of transistor 22. Node 94 between the source and drain of transistors 50 and 22 is connected though a BR (buried) resistor means 26 to output node PAD of the driver.

Figure 2:
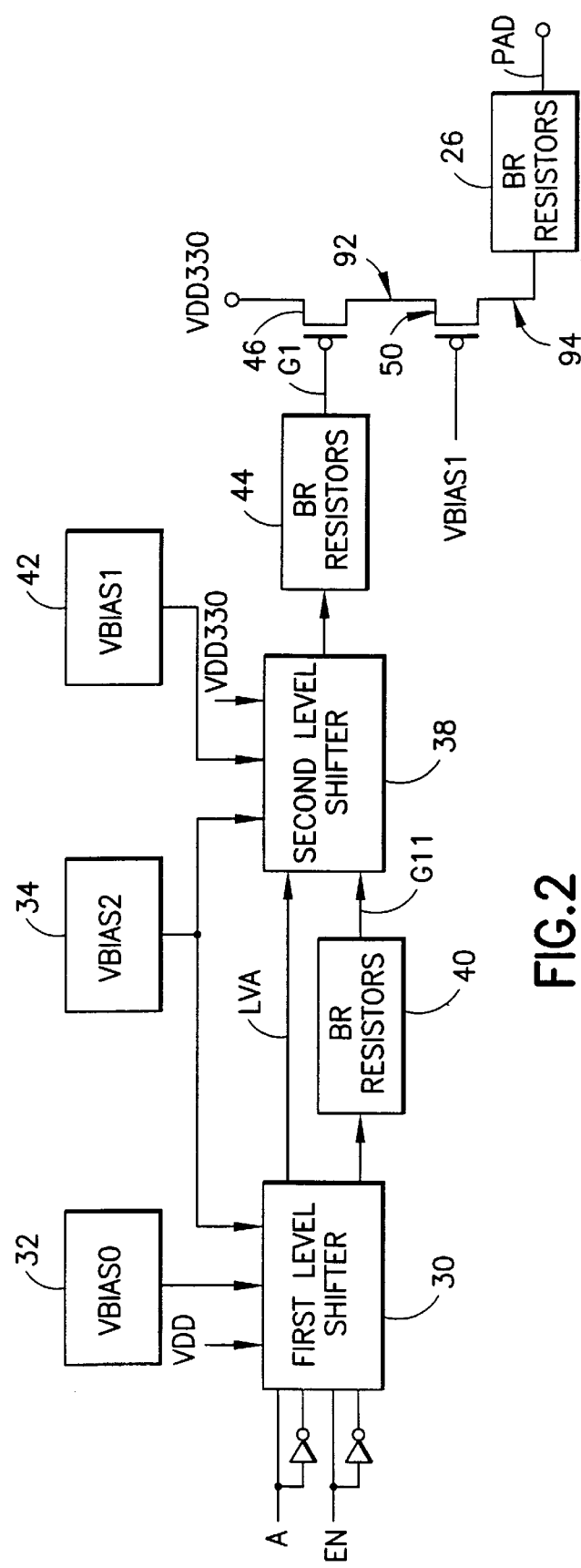
FIG. 2 is a schematic block diagram illustrating the details of an embodiment of the dual stage level shifter predrive circuit of FIG. 1.

Referring to FIG. 2, a schematic illustration of the dual stage level shifter predrive circuit 14 of FIG. 1 is shown. A first stage level shifter circuit 30 accepts data via input signal A and is set for a functional operating mode via the input signal EN. In the present embodiment the switching range of first stage level shifter circuit 30 is in the order of from 0.40 volts to 2.7 volts. The switching range is generally a factor of the circuit operating conditions which are determined by the voltage, temperature and process range for a given technology. For current deep sub-micron IC technologies employing a single oxide layer, the power supply Vdd is 1.8 volts (nominal), power supply VDD 330 is 3.3 volts (nominal), and the nominal junction temperature Tj is 50 degrees C.

The 0.40 to 2.7 volt switching range of first stage level shifter circuit 30 is attained using DC bias circuit 32 that provides a DC bias voltage VBIAS0 and DC bias circuit 34 that provides a DC bias voltage VBIAS2. VBIAS0 operates at 0.45 (nominal) volts above ground and VBIAS2 operates at 2.5 volts (nominal) above ground. A common industry trend is the scaling of voltage with oxide layer device thickness. The lower the voltage, the less oxide thickness required. Hence it is becoming more challenging to offer higher voltage interfaces (CMOS or LVTTL) in shallow oxide technologies. Therefore, the function of bias voltage circuits 32 and 34 is to prevent dielectric voltage stress Vgs from exceeding 2.4 in the current deep submicron, single oxide layer IC technology.

The output signal from level shifter circuit 30 on node LVA is applied to the second stage level shifter circuit 38. Another output signal from the first level shifter circuit 30 is connected to second level shifter circuit 38 via a BR (buried) resistor means 40 which is used for di/dt control, and node G11. BR resistor means 40 is provided to reduce di/dt which is beneficial when the integrated circuit is packaged in plastic and laminate which are susceptible to noise effects.

In addition to the two signals from the output of the first stage level shifter 30 on nodes G11 and LVA, the second stage level shifter circuit 38 accepts a bias signal VBIAS1 from DC bias circuit 42 to facilitate switching to VDD2 (3.0 volts to 3.6 volts) without exceeding Vgs=2.4 volts for the example of Cmos 7s technology. The switching range extends from 1.2 volts to 3.6 volts. Another BR (buried) resistor means 44 control di/dt (the slew rate).

The output signal from the second stage level shifter circuit 38 is applied to a driver output having a pull-up section 92 including an upper stacked PFET 46 and a lower stacked PFET 50 that is always on and is tied to the VBIAS1 voltage from bias circuit 42.

In the functional operation mode, when the first stage level shifter circuit 30 input signal A=1, the output of the second stage level shifter circuit 38 ranges from 1.2 volts (worst case) to 1.5 volts (best case), therefore the upper stacked PFET 46 is on. Since the lower stacked PFET 50 is always on, the driver output on node 110 pulls up to VDD2.

In contrast, when in the functional operation mode wherein input signal A=0, the output of the second stage level shifter circuit 38 is the operating voltage VDD2, therefore the upper stacked PFET 46 is fully shut off and the pull-up section 48 is disabled.

Figure 3:
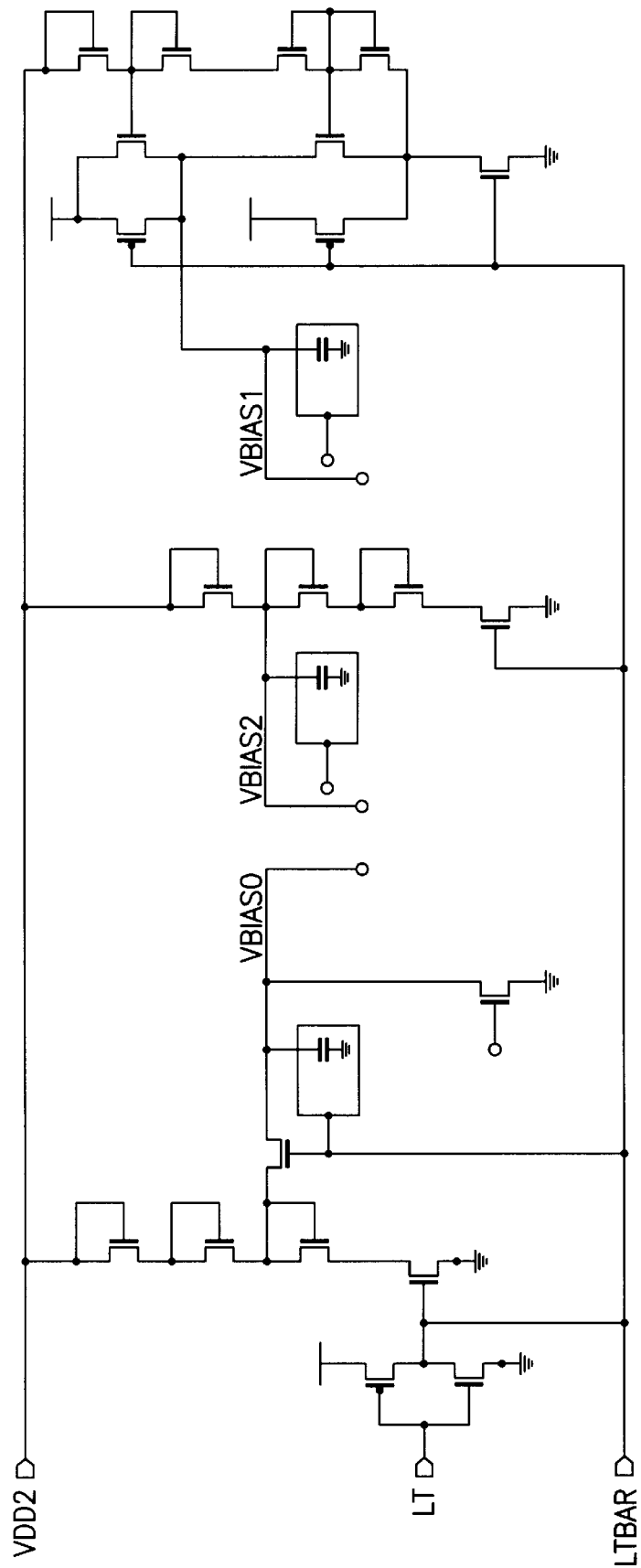
FIG. 3 is a transistor circuit diagram illustrating the components of the bias circuits shown in FIG. 2.
Figure 4A:
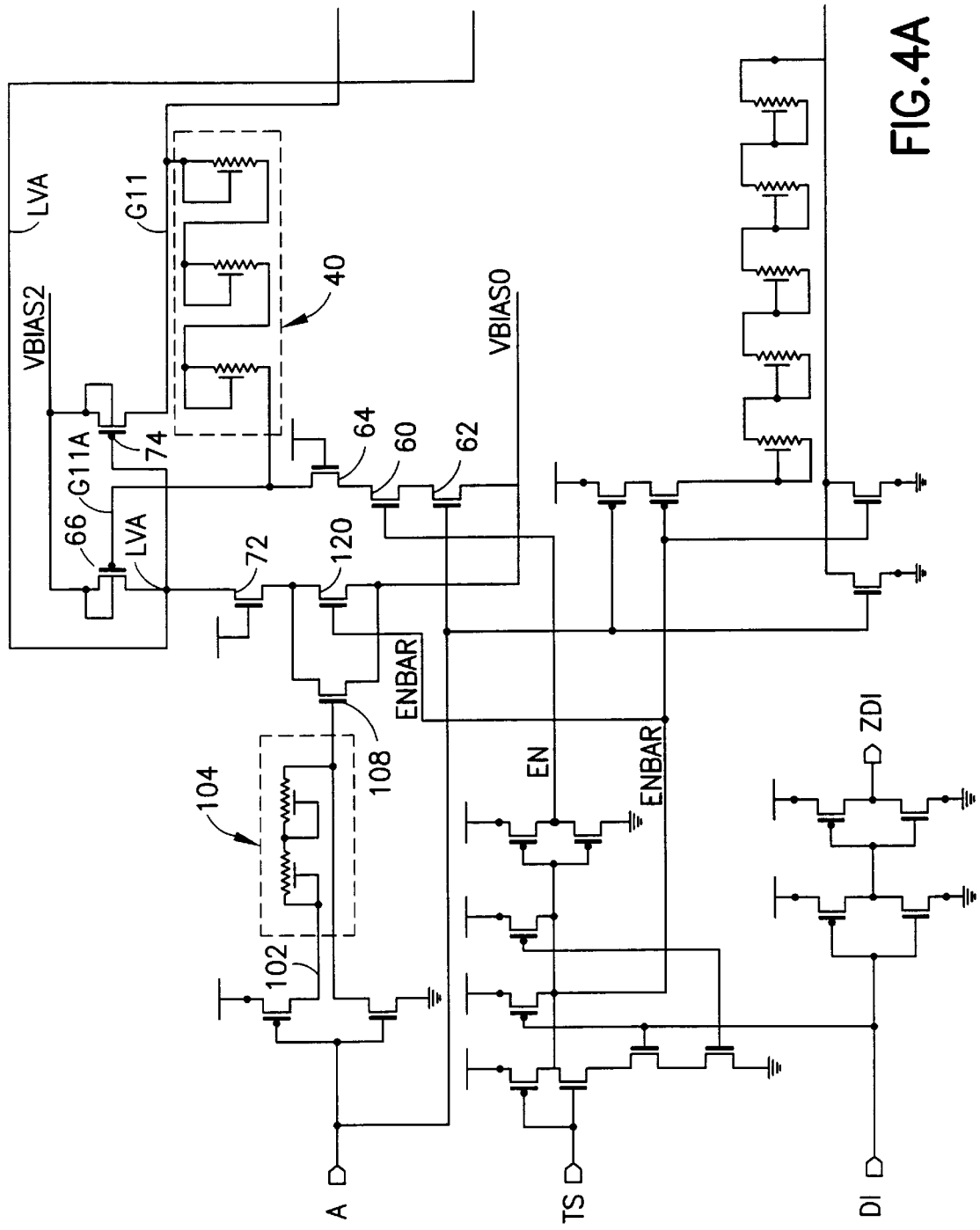
FIG. 4A and 4B when combined provide a circuit diagram illustrating the dual stage level shifter predrive circuit in combination with other components of the level shifting circuit.
Figure 4B:
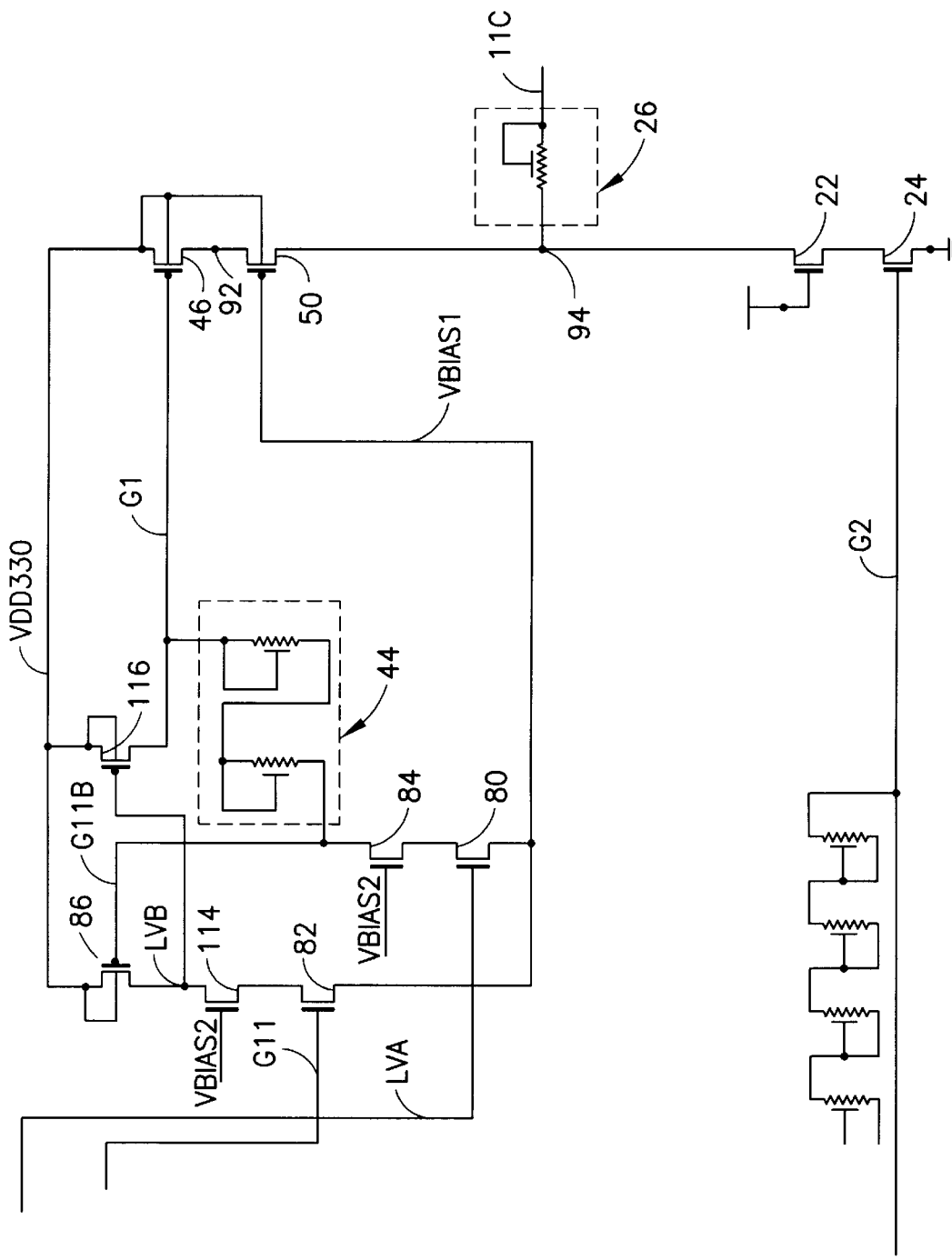

Referring to FIGS. 3 and 4A and 4B, the transistor circuits for the dual stage level shifter circuit of FIG. 2 are shown in more detail. In FIGS. 4A and 4B, "A" is the data input to the first stage level shifter circuit 30 that varies from 0 volts to Vdd volts. "TS" is a tri-state signal that is at 0 volts when active and Vdd volts when inactive. "DI" is the driver inhibit signal that is at 0 volts when active and Vdd volts when inactive. "LT" is a leakage test signal that is at Vdd volts when active and 0 volts when inactive.

When the driving logic is "1", for functional mode conditions TS=1, DI=1, A=1, and LT=0, EN is at the voltage Vdd. The EN signal is applied to the gate of NFET 60 of the first stage level shifter circuit 30 and the A signal is connected to the gate of NFET 62. Since A=1, the gate of NFET transistor 62 to which it is connected is also at Vdd volts. Thus, since transistor 64 is always on, and NFETs 60 and 62 are on, approximately 0.4 volts from the VBIAS0 DC bias circuit 32 is transmitted to the gate of transistor 66. With transistor 66 strongly on, node LVA is raised to the value VBIAS2 volts.

It is to be noted that level shifter circuit 30 is complementary, meaning that one side is active while the other side is inactive, and vice versa. For example, if node 70 is at VBIAS0 volts (transistors 60, 64, 62 and 66 being on), then node LVA is at VBIAS2 volts. With the gate of transistor 108 off, the path from node LVA to the VBIAS0 voltage is disconnected and inactive.

With node 68 at VBIAS2 volts, PFET transistor 74 is completely shut off. Also, since A=1 and EN=1, VBIAS0 voltage is applied to node G11A and BR resistor means 40 to output node 76. Therefore, the outputs of level shifter circuit 30 are VBIAS2 volts on node 68 and VBIAS0 volts on node 76 for driving a logic "1" from data input "A". 20

First stage level shifter 30 output nodes G11 and LVA are connected to Zero Vt NFET transistors 82 and 80 respectively of second stage level shifter circuit 38. Zero Vt NFET transistors are used because these devices have little or no threshold voltage, and are thus easier to turn on when a logic "1" is applied to their gate, as opposed to standard NFETs with intrinsic threshold voltages.

With the gate of NFET transistor 80 at VBIAS2 volts, along with the gate of transistor 84 at VBIAS2 volts, the voltage VBIAS1 at the source of transistor 80 is passed to two locations, first to the gate of PFET transistor 86 via node G11B, and second through the BR resistor means 44 and to output node G1.

It is noted the second stage level shifter circuit 38 is also complementary, meaning that one side is active while the other side is inactive, and vice versa. For example, if node G11B is at VBIAS1 volts (transistors 86, 84 and 80 being on), this path is active and node LVB is at VDD2 volts. Since the gate of Zero Vt NFET 82 is off (e.g. at VBIAS0 volts), the path between node LVB and VBIAS1 is disconnected and inactive.

With VBIAS1 volts applied at the gate of PFET 86, node LVB is raised to VDD2 volts such that the PFET 116 is completely shut off. The VBIAS1 voltage on output node G1 causes the upper stacked output PFET 46 to be on, so node 92 rises to VDD2 volts. Since VBIAS1 volts are applied to the lower stacked output PFET 50, node 94 is raised to VDD2, and this signal is propagated through the BR resistor means 26 to output node PAD. Thus, in the functional mode, with signal A high (at Vdd volts) the output signal on node PAD pulls up to VDD2 volts.

When the driving logic is "0" for functional mode conditions A=0, DI=1, TS=1, and LT=0, EN is at the voltage Vdd which is applied to NFET 60 of the first stage level shifter circuit 30. Since A=0, the gate of NFET 62 is off. With A=0, the voltage on node 102 is raised to Vdd. This voltage is transmitted through BR resistor means 104 onto the gate of NFET transistor 108. With NFET 108 on and NFET 72 always on, node LVA becomes VBIAS0 volts. The VBIAS0 voltage on node LVA is applied to the gate of transistor 74 causing output node G11 to rise to VBIAS2 volts. This voltage is fed back through the BR resistor means 40 to the gate of PFET transistor 66, serving to shut transistor 66 off.

It was previously noted that first stage level shifter circuit 30 is complementary, meaning one side is active while the other side is inactive, and vice versa. For example, if node LVA is at VBIAS0 volts (transistors 74, 72 and 108 being on), then node G11A is at VBIAS2 volts. Since the gate of NFET 62 is off, (e.g. A=0), the path between node G11A and the VBIAS0 voltage is disconnected and inactive. Therefore the output signals of first stage level shifter circuit 30 are VBIAS2 volts on node G11 and VBIAS0 volts on node G11A for driving a logic "0."

Nodes G11 and LVA are connected to Zero Vt NFETS 82 and 80 respectively of second stage level shifter circuit 38. With the gate of transistor 82 at VBIAS2 volts, along with the gate of transistor 114 at VBIAS2 volts, the voltage VBIAS1 at the source of transistor 82 is applied to PFET 116.

It was previously noted that the second stage level 20 shifter circuit 38 is complementary, meaning one side is active while the other side is inactive, and vice versa. For example, if node LVB is at VBIAS1 (e.g. transistors 82, 114 and 116 being on), then output node G1 is raised to VDD2 volts. This VDD2 voltage signal then propagates back through BR resistor means 44 and is applied to the gate of PFET 86, serving to fully shut it off. Since the gate of transistor 80 is essentially off (at VBIAS0 volts), there is no connection between node G11B and the VBIAS1 voltage, and this path is inactive.

With VBIAS1 volts at the gate of PFET 116, output node G1 is raised to VDD2 volts such that the upper stacked to PFET 46 is completely shut off. Even though VBIAS1 volts are applied to the lower stacked PFET 50, the upper stacked PFET 46 is off and no current is sourced from the stacked PFET pullup stage.

For the Tri-State mode for the driver wherein A=X, DI=X, TS=0 and LT=0, the notEN (ENbar) signal is at Vdd volts for TS=0. The Vdd voltage is applied to NFET 120 of first stage level shifter circuit 30. With the gate of NFET 120 at Vdd volts, along with NFET 72 always on, node LVA becomes VBIAS0 volts. The VBIAS0 volts on the gate of PFET 74 causes output node G11 to rise to VBIAS2 volts. The VBIAS2 voltage is fed back through BR resistor means 40 to the gate of PFET 66, serving to shut PFET 66 off.

As was previously stated, first stage level shifting circuit 30 is complementary, meaning one side is active while the other side is inactive, and vice versa. For example, if node LVA is at VBIAS0 volts, (transistors 74, 72 and 120 being on) then node G11A is at VBIAS2 volts. Because the gate of NFET 64 is off (e.g. EN=0), the path between node G11A and the VBIAS0 voltage is disconnected and inactive. Therefore the output voltage signal of first stage level shifter circuit 30 are VBIAS2 volts on node G11 and VBIAS0 volts on node 68.

The VBIAS2 voltage on node G11 and the VBIAS0 voltage on node LVA are applied to Zero Vt NFETS 82 and 80 respectively. With the gate of transistor 82 at VBIAS2 volts, along with the gate of Zero Vt 114 at VBIAS2 voltage, the voltage VBIAS1 at the source of transistor 82 is applied to the gate of PFET 116.

As was previously stated, second stage level shifting circuit 38 is complementary, meaning one side is active while the other side is inactive, and vice versa. For example, if node 98 is at VBIAS1 volts, (transistors 116, 114 and 82 being on) then output node G1 is raised to VDD2 volts. This signal propagates back through BR resistor means 44 to the gate of PFET 86, serving to fully shut PFET 86 off. Because the gate of Zero Vt NFET 80 is essentially off (at VBIAS0 volts), the path between node G11B and the VBIAS1 voltage is disconnected and inactive.

With VBIAS1 volts applied to the gate of PFET 116, node G1 is raised to VDD2 such that the upper stacked PFET 46 is completely shut off. Even though VBIAS1 volts are applied to the lower stacked PFET 50, the upper stacked PFET 46 is off, therefore no current is sourced from the stacked PFET pullup stage.

What has been described is a dual stage voltage level predrive circuit for an integrated circuit chip including two level shifter stages in series and having no feedback paths or threshold dependence. The voltage level shifting circuit uses single dielectric layer devices and at least three bias supply circuits each providing a different DC bias voltage for distributing bias voltages among the devices such that dielectric voltage stress across single dielectric layers is reduced. The first stage of the level shifting circuit receives a first input signal having a first voltage swing, converts the first voltage swing to a second voltage swing and provides a first output signal corresponding to the first input signal and having the second voltage swing. The second stage of the level shifting circuit receives the first output signal from the first stage, converts the second voltage swing to a third voltage swing and provides a final output signal having the third voltage swing.

While the invention has been described in connection with a preferred embodiment, it is not intended to limit the scope of the invention to the particular form set forth, but on the contrary, it is intended to cover such alternatives, modifications and equivalence as may be included within the spirit and scope of the invention as defined in the appended claims.

What is claimed is:

1. An integrated circuit chip comprising:
   a dual voltage level shifter having single dielectric layer devices;
   at least three bias supply circuits each providing a different bias voltage value for distributing bias voltages among the devices such that dielectric voltage stress across single dielectric layers is reduced; and
   the dual voltage level shifter further having;
   a first voltage level shifting stage coupled to a first one and a second one of the bias supply circuits, for receiving a first input signal having a first voltage level swing and for converting the first voltage level swing to a second voltage level swing for providing a first output signal corresponding to the first input signal and having the second voltage level swing;
   a second voltage level shifting stage coupled to the second one and a third one of the bias supply circuits, for receiving the first output signal, for converting the second voltage level output signal swing of the first output signal to a third voltage level swing, and for providing a final output signal having the third voltage level swing.

2. The integrated circuit chip of claim 1, wherein one of the at least three bias supply circuits transmits transient noise to the second stage, and wherein the second voltage level shifting stage includes a plurality of Zero Vt transistors for operating normally in the presence of the noise and independently of threshold voltage.

3. The integrated circuit chip of claim 1, wherein the second voltage level shifting stage includes a BR resistor having a size selectable for controlling a di/dt of the final output signal.

4. The integrated circuit chip of claim 3, wherein the BR resistor comprises a size sufficient to limit the di/dt of the final output signal within the operable magnitude.

5. The integrated circuit chip of claim 1, wherein the first input signal to the first voltage level shifting stage of the dual voltage level shifter varies from 0 volts to VDD volts, and the first voltage level shifting stage further receives a second input signal that provides a functional mode condition voltage.

6. The integrated circuit chip of claim 5 wherein the first voltage level shifting stage of the dual voltage level shifter includes a first FET device having a gate connected to the first input signal and a second FET device having a gate connected to the second input signal for gating the first one of the bias supply circuits to a first output node and to the gate of a third FET device for connecting the second one of the bias supply circuits to a second output node.

7. The integrated circuit chip of claim 1 wherein the output signal from the second voltage level shifting stage of the dual voltage level shifter is applied to a driver output having a pull-up section including an upper stacked transistor device and a lower stacked transistor device that is always on and is connected to the first one of the bias supply circuits.

8. The integrated circuit chip of claim 7 wherein, in a first functional mode condition the output of the second voltage level shifting stage of the dual voltage level shifter turns the upper stacked transistor device on and pulls up the driver output voltage.

9. The integrated circuit chip circuit of claim 7 wherein, in a second functional mode condition the output of the second voltage level shifting stage of the dual voltage level shifter turns the upper stacked transistor device off and the driver output voltage is pulled down.

10. The integrated circuit chip of claim 1 wherein the first and second voltage level shifting stages of the dual voltage level shifter are complementary circuits wherein when one side of the circuit is active the other side of the circuit is inactive.

11. The integrated circuit chip of claim 1 wherein the second voltage swing of the first voltage level shifting stage is in the order of from 0.40 volts to 2.7 volts.

12. The integrated circuit chip of claim 11 wherein the third voltage swing of the second voltage level shifting stage is in the order of from 1.2 volts to 3.6 volts.

* * * * *